(12) United States Patent
Jenniskens et al.

(10) Patent No.: US 6,882,150 B2
(45) Date of Patent: Apr. 19, 2005

(54) DIFFUSION WEIGHTED MULTIPLE SPIN ECHO (RARE) SEQUENCE WITH PERIODICALLY AMPLITUDE-MODULATED CRUSHER GRADIENTS

(75) Inventors: Hans Gerard Jenniskens, Eindhoven (NL); Gerrit Hendrik Van Yperen, Eindhoven (NL); Johannes Petrus Groen, Eindhoven (NL)

(73) Assignee: Koninklijke Philips Electronics, N.V., Eindhoven (NL)

(*) Notice: Subject to any disclaimer, the term of this patent is extended or adjusted under 35 U.S.C. 154(b) by 0 days.

(21) Appl. No.: 10/498,415

(22) PCT Filed: Nov. 27, 2002

(86) PCT No.: PCT/IB02/05028

§ 371 (c)(1),
(2), (4) Date: Jun. 10, 2004

(87) PCT Pub. No.: WO03/052445

PCT Pub. Date: Jun. 26, 2003

(65) Prior Publication Data

US 2005/0001616 A1 Jan. 6, 2005

(30) Foreign Application Priority Data

Dec. 19, 2001 (EP) .......................................... 01205007

(51) Int. Cl.$^7$ .............................................. G01V 3/00
(52) U.S. Cl. ..................................... 324/309; 324/307
(58) Field of Search ................................ 324/309, 307, 324/311, 312, 314; 600/410, 411, 420

(56) References Cited

U.S. PATENT DOCUMENTS

| 6,078,176 A | 6/2000 | McKinnon |
| 6,664,787 B1 * | 12/2003 | Miyoshi et al. ............. 324/307 |
| 6,751,495 B1 * | 6/2004 | Maier et al. ................ 600/410 |
| 6,788,055 B1 * | 9/2004 | McKinnon et al. ......... 324/309 |

FOREIGN PATENT DOCUMENTS

WO          WO 99/53343          10/1999

OTHER PUBLICATIONS

Alsop, David C.; Phase Insensitive Preparation of Single–Shot RARE: Application to Diffusion Imaging in Humans; MRM; 1997; vol. 38; pp. 527–533.
Mori, S., et al.; A Motion Correction Scheme by Twin–Echo Navigation; MRM; 1998; vol. 40; pp. 511–516.
Williams, C., et al.; A Novel Fast Split–Echo Multi–Shot Diffusion–Weighted MRI Method; MRM; 1999; vol. 41, pp. 734–742.

* cited by examiner

*Primary Examiner*—Louis Arana
(74) *Attorney, Agent, or Firm*—Thomas M. Lundin

(57) ABSTRACT

A magnetic resonance imaging method which involves a pulse sequence for generating magnetic resonance signals and in which diffusion weighting is applied, for example, by way of a pair of gradient pulses which are separated by a 180° refocusing RF pulse. The magnetic resonance signals are generated as spin echo signals due to refocusing pulses. The refocusing pulses are flanked by compensation gradient pulses and the gradient strengths of the compensation gradient pulses are alternated according to a periodic pattern.

9 Claims, 2 Drawing Sheets

Figure 1:
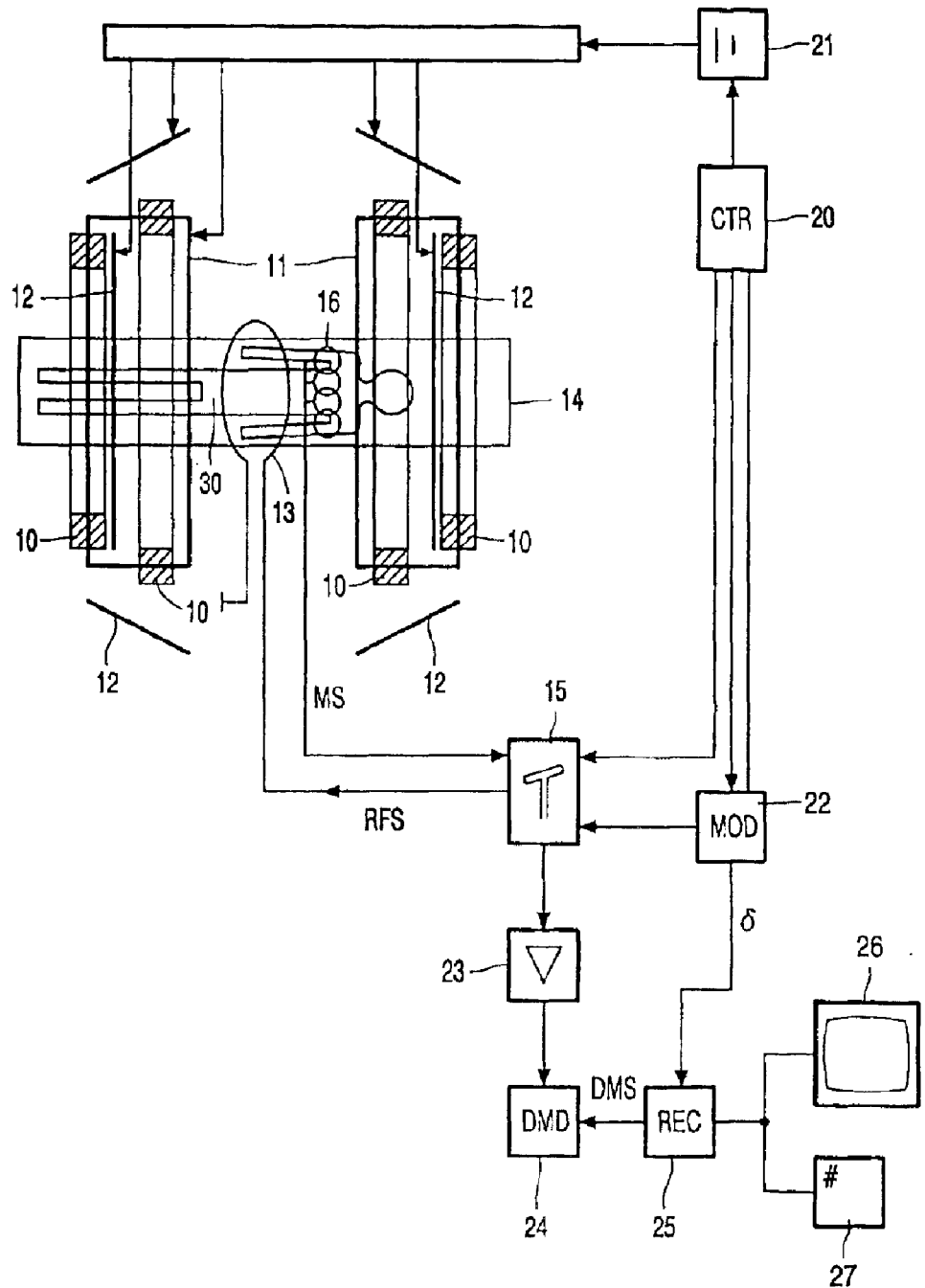

DIFFUSION WEIGHTED MULTIPLE SPIN ECHO (RARE) SEQUENCE WITH PERIODICALLY AMPLITUDE-MODULATED CRUSHER GRADIENTS

The invention relates to a magnetic resonance imaging method in which a pulse sequence (50) is applied in order to generate magnetic resonance signals, the pulse sequence includes refocusing pulses (521 to 527) for generating the magnetic resonance signals as spin echo signals.

A magnetic resonance imaging method of this kind is known from the article 'Phase insensitive preparation of single-shot RARE: application to diffusion imaging in humans' by D. C. Alsop in Magnetic Resonance in Medicine 38 (1997) pp. 527–533.

The known magnetic resonance imaging method utilizes a pulse sequence in the form of a RARE (Rapid Acquisition with Relaxation Enhancement) sequence which is also referred to as a turbo spin echo (TSE) sequence. Using this RARE sequence, the magnetic resonance signals are generated in the form of spin echo magnetic resonance signals. The cited article points out that, when diffusion gradients are applied so as to realize the diffusion weighting, a spatially varying phase shift of the magnetic resonance signals occurs due to motion of or in the patient to be examined, thus giving rise to artefacts in the magnetic resonance image which is reconstructed from the spin echo magnetic resonance signals. In order to avoid such artefacts, a dephasing gradient is applied prior to the RARE sequence. Furthermore, a 90° RF pulse is applied at the halfway point of the echo time for the first spin echo magnetic resonance signal. Additionally, a respective rephasing gradient is applied directly before each acquisition of the spin echo signals. Furthermore, immediately after each acquisition of the spin echo magnetic resonance signals, reversing gradients are applied. Contributions to the spin echo magnetic resonance signals by a refocusing sequence which does not satisfy the so-called CPMG (Car-Purcell-Meibohm-Gill) condition are suppressed in this manner. The known method thus also avoids the artefacts caused by such a non-CPMG contribution.

It is an object of the invention to provide a multi-echo magnetic resonance imaging method which is hardly sensitive to motion and enhances the signal-to-noise ratio of the magnetic resonance signals received.

This object is achieved by means of a magnetic resonance imaging method in accordance with the invention in which phase influencing of the spin echo signals is carried out by flanking individual refocusing pulses with respective pairs of compensation gradient pulses (531, 532, . . . , 535, 536) having respective gradient strengths, and a periodic alternation of different gradient strengths of the pairs of compensation gradient pulses is applied for successive refocusing pulses.

Because of the phase influencing of the spin echo signals it is achieved that phase errors are propagated to a lesser extent and in a more accurately predictable manner in the successive magnetic resonance signals. More specifically, the phase error is substantially smaller and much more accurately predictable than the phase errors occurring in magnetic resonance imaging methods without compensation gradient pulses, for example, as known from the article 'Phase insensitive preparation of single-shot RARE: application to diffusion imaging in humans' by D. C. Alsop in Magnetic Resonance in Medicine 38 (1997) pp. 527–533. These phase errors may be caused by various initialisation operations that precede the pulse sequence which generates the magnetic resonance signals. When the initialisation operation concerns diffusion weighting, inaccuracies in the diffusion weighting and motion of the object to be examined during the diffusion weighting cause phase errors. Diffusion weighting may be generated by a bipolar gradient pulse pair preceding the pulse sequence or by a pair of gradient pulses having the same sign and being separated by a 180° RF pulse. Another example of the initialisation operation concerns the application of an earlier RF excitation so as to enable generation of magnetic resonance signals at different echo spacings so as to generate T2*-weighted signal amplitude. The invention achieves a reduction of phase variations caused by variations of the main (B0) field. A further example of the initialisation operation concerns imposing flow-encoding so as to enable phase-contrast imaging, such as phase contrast angiography. In this example, the invention achieves a more accurate measurement of the imposed phase variations and suppresses unintentional phase errors. Imperfections in the refocusing pulses cause unintended longitudinal magnetization components which are capable of causing stimulated echoes subsequent to imperfect refocusing pulses. Notably phase mixing of direct and stimulated echoes is avoided by way of the periodic alternation of the gradient strengths of the pairs of compensation gradient pulses of the successive refocusing pulses. The phase influencing is preferably realized by flanking a part of the refocusing pulses with the compensation gradient pulses. The directions of the compensation gradient pulses are the same, but the direction in which the compensation gradients are oriented can be chosen at random. The refocusing pulses are flanked each time by pairs of compensation gradient pulses, that is, in such a manner that one compensation gradient pulse of such a pair precedes the relevant refocusing pulse while the other compensation gradient pulse of the pair succeeds the relevant refocusing pulse. In that case no acquisition of magnetic resonance signals takes place between the refocusing pulse and each of the compensation gradient pulses of the pair associated with the relevant refocusing pulse.

These and other aspects of the invention will be described in detail hereinafter on the basis of the following embodiments which are defined in the dependent claims.

In accordance with the invention refocusing pulses flanked by a pair of compensation gradient pulses alternate with non-flanked refocusing pulses in the succession of refocusing pulses. Such a non-flanked refocusing pulse actually comes down to the choice of a gradient strength equal to zero for the compensation gradient pulses for the non-flanked refocusing pulse. Due to the alternation of flanked and non-flanked refocusing pulses, phase mixing of direct and stimulated echoes is avoided. The compensation gradient pulses cause a given degree of dephasing and rephasing of the spins forming the spin echoes. The contributions to spin echoes are of odd or even parity, depending on whether these contributions have experienced an odd or an even number of refocusing effects. It has been found that contributions of the same parity in spin echoes propagate each time the same phase error. In accordance with the invention the phases of the spin echo magnetic resonance signals can be influenced by the alternation of flanked and non-flanked refocusing pulses in such a manner that each time spin echo contributions of the same parity are combined so as to form spin echo magnetic resonance signals in which the phase error often remains small and varies practically always in a suitably predictable manner. It has been found notably that when an alternation of flanked and non-flanked refocusing pulses is used, an alternating and usually comparatively small phase error occurs between spin echo magnetic resonance signals due to spin echoes having an odd or an even parity.

Other pulses, for example, gradient pulses such as the compensation gradient pulses and read-out gradients can be applied between the refocusing pulses in the pulse sequences, but suitable results are obtained notably when the first refocusing pulse after a refocusing pulse of the non-flanked group is a refocusing pulse of the flanked group and when the first refocusing pulse after a refocusing pulse of the flanked group is a refocusing pulse of the non-flanked group. Consequently, there remains only a phase error which oscillates between successive magnetic resonance signals and does not increase over a prolonged period of time. As a result, the phase error remains accurately predictable and hence can be simply corrected for during the reconstruction.

Particularly favorable results are obtained by using as equal as possible time integrals for both members of the pair of compensation gradient pulses. As a result, any phase error at the beginning of the pulse sequence essentially can give rise to only an oscillating phase error of the successive magnetic resonance signals which are generated as spin echo magnetic resonance signals by the refocusing pulses. The consequences of such an oscillating phase error can be accurately corrected for.

In order to compensate for the consequences of such an oscillating phase error, the phase difference is determined between magnetic resonance signals generated after an odd number of refocusing pulses and an even number of refocusing pulses, respectively, that is, the magnetic resonance signals generated as spin echo magnetic resonance signals after an odd number of refocusing pulses and an even number of refocusing pulses, respectively, in the non-flanked group and the flanked group. In the case of alternating non-flanked refocusing pulses and flanked refocusing pulses, magnetic resonance signals are obtained from spin echoes contributions from odd and even parity, that is, each time directly subsequent to the same type of flanked or non-flanked refocusing pulses. The phase difference between magnetic resonance signals due to spin echoes with odd and with even parity is taken into account for the reconstruction of the magnetic resonance image. Favorable results are obtained notably when the non-flanked and flanked refocusing pulses alternate, that is, by taking the phase difference between successive magnetic resonance signals due to spin echoes with odd and with even parities. This phase difference is obtained, for example, by forming, subsequent to one of the non-flanked refocusing pulses and one of the flanked refocusing pulses, so-called navigator echoes which are not phase encoded. The phase difference between successive magnetic resonance signals due to these navigator spin echoes with odd and with even parities accurately represents the oscillating phase error. In the reconstruction of the magnetic resonance image notably "ghost images" can be avoided on the basis of this phase difference. Preferably, the correction for the oscillating phase error is obtained as half the phase difference between two successive magnetic resonance signals in the form of, for example, navigator spin echoes having different parities.

Preferably, the phases of the refocusing pulses are varied relative to one another in conformity with a periodically recurrent pattern of preferably mutual phase 0° and 180° between successive refocusing pulses. The alternation of phase differences comes down to an alternation of the direction of the axis around which the spins are rotated by the refocusing pulses. It has been found that the decrease of the amplitude of successive spin echoes is thus avoided to a substantial degree. Suitable results are obtained in particular by means of a repetition of the pattern:

[0, 0, 180, 180].

Even better results are obtained by means of a repetition of a somewhat more complex pattern:

[0, 0, 180, 180, 180, 0, 0, 180, 180, 180, 0, 0, 0, 180, 180, 0].

Even longer patterns can be generated on the basis of phase differences which constantly change in a cyclical fashion.

The phase difference between two magnetic resonance signals in the form of spin echo magnetic resonance signals, both generated by flanked refocusing pulses or both generated by non-flanked refocusing pulses, represents a monotonous increase of the phase error in as far as it is not completely suppressed. Notably eddy currents generated by the compensation gradient pulses lead to a monotonously increasing phase error. Thus, correction can be made for a small residual monotonously increasing phase error by adapting the phases of the refocusing pulses relative to one another. This value of the monotonously increasing phase error is particularly accurate in the case of an alternation of flanked and non-flanked refocusing pulses.

In order to carry out the correction for phase errors caused by eddy currents, notably by the compensation gradient pulses, use is preferably made of a preparation pulse sequence which can be applied before or after the diffusion-weighted pulse sequence. The preparation pulse sequence generates preparation magnetic resonance signals, in this case being preparation spin echo magnetic resonance signals. The preparation pulse sequence does not include diffusion weighting, but is otherwise identical to the pulse sequence succeeding the diffusion-weighted pulse sequence. From the preparation spin echo magnetic resonance signals there are determined the phase differences whereby the phases of refocusing pulses in the diffusion-weighted pulse sequence are adapted so as to counteract phase errors due to eddy currents. The application of such a preparation pulse sequence for the correction of another pulse sequence, such as the diffusion-weighted pulse sequence, is known per se from the international application WO 99/53343.

The invention also relates to a magnetic resonance imaging system. A magnetic resonance imaging system in accordance with the invention is defined in claim 8. Such a magnetic resonance imaging system in accordance with the invention enables the magnetic resonance imaging method in accordance with the invention to be carried out. The invention also relates to a computer program. A computer program in accordance with the invention can be loaded into the working memory of a computer of a magnetic resonance imaging system. The magnetic resonance imaging system thus becomes suitable for carrying out the magnetic resonance imaging method in accordance with the invention. However, in that case it is still necessary to instruct the magnetic resonance imaging system to carry out the diffusion weighting operation. Such diffusion weighting, however, is known per se and the instruction for carrying out diffusion weighting operation per se has usually been taken up already in the software in the computer of the magnetic resonance imaging system.

Figure 2:
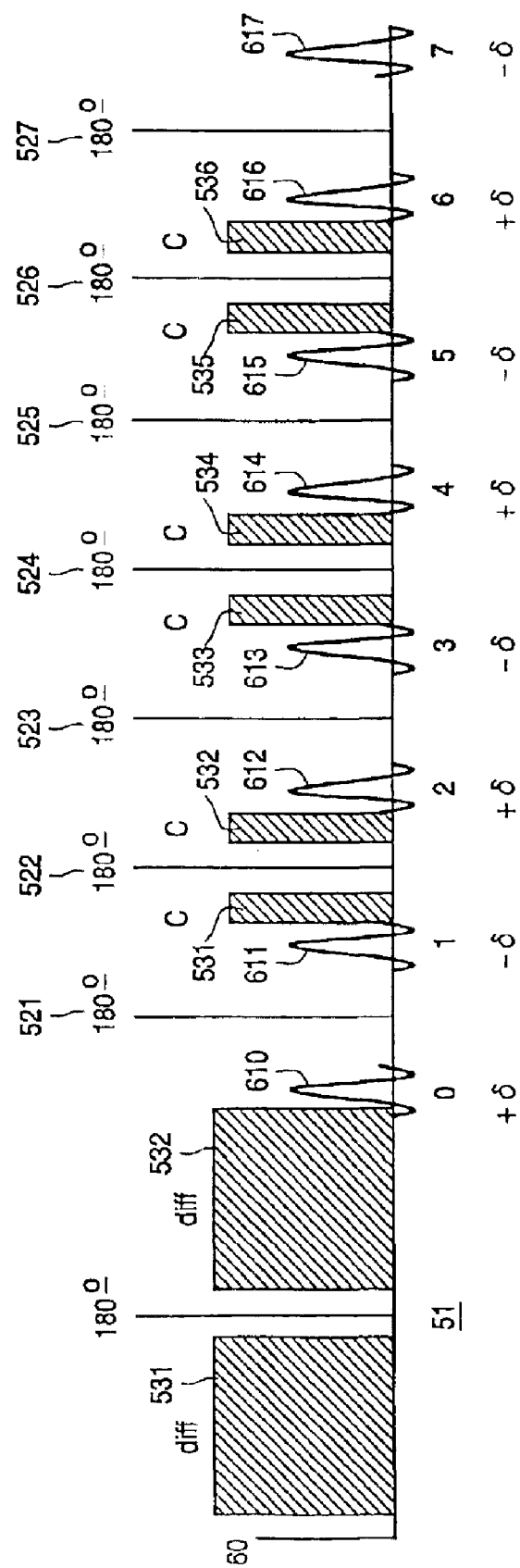

These and other aspects of the invention will be described in detail hereinafter, by way of example, on the basis of the following embodiments and with reference to the accompanying drawing; therein:

FIG. 1 is a diagrammatic representation of a magnetic resonance imaging system in which the invention is used, and FIG. 2 is a graphic representation of an example of a pulse sequence of a magnetic resonance imaging method in accordance with the invention.

FIG. 1 is a diagrammatic representation of a magnetic resonance imaging system in which the invention is used. The magnetic resonance imaging system is provided with a set of main coils 10 whereby the steady, uniform magnetic field is generated. The main coils are constructed, for example, in such a manner that they enclose a tunnel-shaped examination space. The patient to be examined is introduced into this tunnel-shaped examination space. The magnetic resonance imaging system also includes a number of gradient coils 11, 12 whereby the magnetic fields with spatial variations in the form of notably temporary gradients in separate directions are superposed on the uniform magnetic field. The gradient coils 11, 12 are connected to a controllable power supply unit 21. The gradient coils 11, 12 are energized by application of electric currents thereto by way of the power supply unit 21. The strength, direction and duration of the gradients are controlled by control of the power supply unit. The magnetic resonance imaging system also includes transmission and receiving coils 13, 15 for generating the RF excitation pulses and for receiving the magnetic resonance signals, respectively. The RF excitation pulses excite (nuclear) spins in the object to be examined, or the patient to be examined, that is, in the steady magnetic field. Subsequently, the excited (nuclear) spins relax while emitting magnetic resonance signals. The magnetic resonance signals may be free induction decay (FID) signals, but magnetic resonance echoes may also be generated. In particular spin echo signals can be generated by application of refocusing RF pulses. It is also possible to generate gradient echo signals by application of temporary gradient fields. Application of the temporary gradient fields provides spatial encoding of the magnetic resonance signals. The transmission coil 13 is preferably constructed as a body coil 13 whereby (a part of) the object to be examined can be enclosed. The body coil is usually arranged in the magnetic resonance imaging system in such a manner that the patient 30 positioned in the magnetic resonance imaging system is situated within the body coil 13. The body coil 13 acts as a transmission antenna for the transmission of the RF excitation pulses and RF refocusing pulses. The body coil 13 preferably has a spatially homogeneous intensity distribution of the transmitted RF pulses. Usually the same coil or antenna is used alternately as a transmission coil and as a receiving coil. Furthermore, the transmission and receiving coil is usually shaped as a coil, but other geometries where the transmission and receiving coil functions as a transmission and receiving antenna for RF electromagnetic signals are also feasible. The transmission and receiving coil 13 is connected to an electronic transmission/receiving circuit 15.

The magnetic resonance imaging system also includes a control unit 20, for example, in the form of a computer which is provided with a (micro)processor and stores a computer program with instructions for carrying out the magnetic resonance imaging method in accordance with the invention. The control unit 20 controls the RF pulses such as excitation pulses and refocusing pulses. Moreover, the control unit controls the gradient pulses in the form of temporary magnetic gradient fields. The control unit 20 notably provides the flanking of the refocusing pulses of the flanked group by means of the compensation gradient pulses. Furthermore, the control unit 20 controls the mutual phases of the successive refocusing pulses. In addition the control unit 20 controls the measurement of the phase difference δ between magnetic resonance signals of the first and the second group. The control unit 20 applies the measured phase difference to the reconstruction unit 25, so that the phase difference is taken into account during the reconstruction of the magnetic resonance image in order to avoid "ghost images".

It is to be noted that it is also possible to use separate receiving coils. For example, surface coils can be used as receiving coils. Such surface coils have a high sensitivity in a comparatively small spatial zone. The transmission coils, such as the surface coils, are connected to a demodulator 24 and the magnetic resonance signals received (RFS) are demodulated by means of the demodulator 24. The demodulated magnetic resonance signals (DMS) are applied to a reconstruction unit. The receiving coil is connected to a preamplifier 23. The preamplifier 23 amplifies the RF resonance signal (RFS) received by the receiving coil and the amplified RF resonance signal is applied to a demodulator 24. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission/receiving circuit 15 activate the transmission coil 13 so as to transmit the RF excitation and refocusing pulses. The reconstruction unit derives one or more image signals, representing the image information of the imaged part of the object to be examined, from the demodulated magnetic resonance signals (DMS). In practice the reconstruction unit 25 is preferably constructed as a digital image processing unit 25 which is programmed to form the image signals from the demodulated magnetic resonance signals representing the image information of the part of the object to be imaged. The signal on the output of the reconstruction unit is applied to a monitor 26 so that the three-dimensional density distribution or the spectroscopic information can be displayed on the monitor. It is also possible to store the signal from the reconstruction unit in a buffer unit 27 while awaiting further processing.

FIG. 2 is a graphic representation of an example of a pulse sequence of a magnetic resonance imaging method in accordance with the invention. The pulse sequence 50 commences with an excitation pulse 60, being a 90° RF pulse in the present example. Subsequently, the diffusion weighting operation 51 is performed by a 180° RF pulse which is flanked by a pair of gradient pulses 531 and 532. Diffusion weighting of this kind is known per se and is described in more detail in the handbook '*Magnetic Resonance Imaging*' by M. T. Vlaardingerbroek and J. A. den Boer (section 7.6). Subsequently, a series of refocusing pulses is applied, that is, each time in the form of 180° RF pulses. These refocusing pulses generate each time spin echo magnetic resonance signals 610, 611 to 617. Moreover, by using read gradients and phase encoding gradients, the spin echo magnetic resonance signals are spatially encoded. The refocusing pulses are flanked and not flanked by the compensation gradient pulses 531, 532, . . . , 535, 536 in an alternating fashion. For example, the 180° RF pulse 522 is flanked by the compensation gradients 531, 532. Therefore, the 180° RF pulse 522 forms part of the flanked group of refocusing pulses. In the example shown in FIG. 2 the flanked group is formed by the 180° RF pulses 522, 524, 526. The non-flanked group is formed by the 180° RF pulses 521, 523, 525, 527. The spin echoes 610 and 611, forming the first magnetic resonance signals of spin echoes having odd and even parities, are acquired as phase navigator echoes, that is, without application of phase encoding. When the first spin echoes 610 and 611, having an odd and an even parity, are used as phase navigator echoes, the acquisition of spin echo magnetic resonance signals, suitable for the reconstruction of the magnetic resonance image with correction for phase errors, can be started soon after the diffusion weighting operation 51. Notably the time then lost for the acquisition of the phase navigator echoes is no longer than the time used for the additional 90° RE pulse in conformity with the known method. The residual phase difference δ is determined from these phase navigator echoes. FIG. 2 also shows the residual phase error which remains when flanked refocusing pulses are used in an alternating fashion in accordance with the invention. The residual phase error alternates between the values ±δ. This phase error is corrected for during the reconstruction of the magnetic resonance image from the magnetic resonance signals.

What is claimed is:

1. A magnetic resonance imaging method in which
   a pulse sequence is applied in order to generate magnetic resonance signals,
   the pulse sequence includes refocusing pulses for generating the magnetic resonance signals as spin echo signals, in which
   phase influencing of the spin echo signals is carried out by flanking individual refocusing pulses with respective pairs of compensation gradient pulses having respective gradient strengths, and
   a periodic alternation of different gradient strengths of the pairs of compensation gradient pulses is applied for successive refocusing pulses.

2. A magnetic resonance imaging method as claimed in claim 1,
   in which the periodic alternation involves two different gradient strengths of the pairs of compensation pulses for successive refocusing pulses in an alternating fashion.

3. A magnetic resonance imaging method as claimed in claim 1 in which
   the pulse sequence includes a non-flanked group of refocusing pulses and a flanked group of refocusing pulses,
   the individual refocusing pulses in the flanked group are flanked by the respective pairs of compensation gradient pulses, and
   no spin echo occurs between the individual compensation gradient pulses of separate refocusing pulses and the relevant refocusing pulse.

4. A magnetic resonance imaging method as claimed in claim 2 in which spin echoes generated after an odd number of refocusing pulses form spin echoes having an odd parity and:
   magnetic resonance signals generated after an even number of refocusing pulses form magnetic resonance signals of spin echoes of even parity,
   a magnetic resonance image is reconstructed from the magnetic resonance signals, and
   the reconstruction is carried out also on the basis of a phase difference between a magnetic resonance signal due to spin echoes of odd parity and a magnetic resonance signal of even parity.

5. A magnetic resonance imaging method as claimed in claim 4, in which use is made of the phase difference between magnetic resonance signals which succeed one another in the pulse sequence, one of said magnetic resonance signals being due to a spin echo of odd parity while the other is due to a spin echo of even parity.

6. A magnetic resonance imaging method as claimed in claim 1, in which the mutual phases between successive refocusing pulses vary through the series of refocusing pulses in accordance with a periodically recurrent pattern of alternating mutual phases.

7. A magnetic resonance imaging method as claimed in claim 6, in which the periodically recurrent pattern of alternating mutual phases includes an alternation of mutual phase 0° and mutual phase 180°.

8. A magnetic resonance imaging system which is arranged
   to generate magnetic resonance signals by application of a pulse sequence,
   carrying out a diffusion weighting operation, in which
   the pulse sequence includes refocusing pulses for generating the magnetic resonance signals as spin echo signals, in which
   phase influencing of the spin echo signals is applied by flanking individual refocusing pulses by means of respective pairs of compensation gradient pulses having respective gradient strengths, and
   a periodic alternation of different gradient strengths of the pairs of compensation gradient pulses is used for successive refocusing pulses.

9. A computer program with instructions for executing a pulse sequence, in which
   the pulse sequence includes refocusing pulses for generating spin echo signals, in which
   phase influencing of the spin echo signals is applied by flanking individual refocusing pulses by means of respective pairs of compensation gradient pulses having respective gradient strengths, and a periodic alternation of different gradient strengths of the pairs of compensation gradient pulses is used for successive refocusing pulses.

* * * * *